(12) United States Patent
Kim et al.

(10) Patent No.: US 11,804,562 B2
(45) Date of Patent: Oct. 31, 2023

(54) SUPERLATTICE PHOTODETECTOR THINNED WITH IMPROVED PERFORMANCE AND METHOD OF MANUFACTURING THE SAME

(71) Applicant: KOREA ADVANCED INSTITUTE OF SCIENCE AND TECHNOLOGY, Daejeon (KR)

(72) Inventors: Sanghyeon Kim, Daejeon (KR); DaeMyeong Geum, Daejeon (KR); SeungYeop Ahn, Daejeon (KR); Jinha Lim, Daejeon (KR)

(73) Assignee: Korea Advanced Institute Of Science and Technology, Daejeon (KR)

( * ) Notice: Subject to any disclaimer, the term of this patent is extended or adjusted under 35 U.S.C. 154(b) by 72 days.

(21) Appl. No.: 17/454,404

(22) Filed: Nov. 10, 2021

(65) Prior Publication Data

US 2022/0149217 A1 May 12, 2022

(30) Foreign Application Priority Data

Nov. 12, 2020 (KR) .......................... 10-2020-0151149

(51) Int. Cl.
| | |
|---|---|
| *H01L 31/0352* | (2006.01) |
| *H01L 31/0232* | (2014.01) |
| *H01L 31/18* | (2006.01) |
| *H01L 49/02* | (2006.01) |
| *H01L 27/144* | (2006.01) |

(52) U.S. Cl.
CPC .. *H01L 31/035236* (2013.01); *H01L 27/1443* (2013.01); *H01L 28/40* (2013.01); *H01L 31/0232* (2013.01); *H01L 31/186* (2013.01)

(58) Field of Classification Search
CPC ......... H01L 31/035236; H01L 31/0232; H01L 31/186; H01L 31/02327; H01L 27/1443; H01L 28/40
See application file for complete search history.

(56) References Cited

U.S. PATENT DOCUMENTS

| | | | | |
|---|---|---|---|---|
| 5,352,904 | A * | 10/1994 | Wen ................ | H01L 31/035236 257/29 |
| 2007/0041679 | A1 * | 2/2007 | Huang ................ | H01L 31/1085 385/37 |
| 2010/0119192 | A1 * | 5/2010 | Fujikata ............... | G02B 6/4204 257/E31.127 |

(Continued)

FOREIGN PATENT DOCUMENTS

| | | |
|---|---|---|
| JP | 2015-175902 A | 10/2015 |
| KR | 10-1624489 B1 | 5/2016 |

*Primary Examiner* — Sitaramarao S Yechuri
(74) *Attorney, Agent, or Firm* — Nixon Peabody LLP

(57) ABSTRACT

Various embodiments relate to a superlattice photodetector and a method of manufacturing the same. The superlattice photodetector includes an absorption layer for absorbing incident light and a waveguide layer coupled with the absorption layer and enabling the incident light to be waveguided within the absorption layer. The waveguide layer may include a periodic structure in which a plurality of metal patterns and a plurality of dielectric patterns are repeatedly arranged. According to various embodiments, the superlattice photodetector can be thinned while having improved performance.

17 Claims, 17 Drawing Sheets

(56) References Cited

U.S. PATENT DOCUMENTS

| | | | |
|---|---|---|---|
| 2011/0012221 A1* | 1/2011 | Fujikata | H01L 31/022408 |
| | | | 257/458 |
| 2013/0113964 A1* | 5/2013 | Sasaki | H01L 27/14629 |
| | | | 257/E31.127 |
| 2014/0363121 A1* | 12/2014 | Lai | G02B 6/124 |
| | | | 385/14 |
| 2015/0180210 A1* | 6/2015 | Yu | G02B 6/12004 |
| | | | 438/24 |
| 2016/0254407 A1* | 9/2016 | Wang | H01L 31/1812 |
| | | | 136/256 |
| 2016/0365463 A1 | 12/2016 | Lee | |
| 2020/0386619 A1* | 12/2020 | Kanamori | H01L 31/02327 |
| 2021/0175276 A1* | 6/2021 | Ives | G02B 6/124 |
| 2021/0217908 A1* | 7/2021 | Preisler | H01L 22/34 |
| 2021/0265513 A1* | 8/2021 | Bian | G02B 6/42 |
| 2022/0208826 A1* | 6/2022 | Yokogawa | H01L 27/14623 |

\* cited by examiner

SUPERLATTICE PHOTODETECTOR THINNED WITH IMPROVED PERFORMANCE AND METHOD OF MANUFACTURING THE SAME

CROSS-REFERENCES TO RELATED APPLICATIONS

This application is based on and claims priority under 35 U.S.C. 119 to Korean Patent Application No. 10-2020-0151149, filed on Nov. 12, 2020 in the Korean intellectual property office, the disclosures of which are herein incorporated by reference in their entireties.

TECHNICAL FIELD

Various embodiments relate to a superlattice photodetector thinned with improved performance and a method of manufacturing the same.

BACKGROUND OF THE DISCLOSURE

In general, a superlattice photodetector includes an absorption layer having a superlattice structure, and detects light having a desired frequency band by absorbing the light through the absorption layer. In this case, the thickness of the absorption layer is an important factor to determine performance of the superlattice photodetector. For example, as the thickness of the absorption layer becomes thick, a noise equivalent temperature difference (NETD) characteristic of the superlattice photodetector is excellent. That is, in the superlattice photodetector, as the thickness of the absorption layer becomes thick, a dark current is decreased, quantum efficiency is improved, a charge integrated capacity is increased, and thus the NETD characteristic is excellent. Accordingly, in order to implement a superlattice photodetector having a reduced size, if the thickness of the absorption layer becomes thin, performance of the superlattice photodetector is also deteriorated.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Various embodiments are directed to providing a superlattice photodetector thinned with improved performance and a method of manufacturing the same.

In an aspect, a superlattice photodetector thinned with improved performance includes an absorption layer for absorbing incident light and a waveguide layer coupled with the absorption layer and enabling the incident light to be waveguided within the absorption layer. The waveguide layer may include a periodic structure in which a plurality of metal patterns and a plurality of dielectric patterns are repeatedly arranged.

In an aspect, a method of manufacturing a superlattice photodetector thinned with improved performance includes preparing an absorption layer for absorbing incident light and forming, on the absorption layer, a waveguide layer for enabling the incident light to be waveguided within the absorption layer. The waveguide layer may include a periodic structure in which a plurality of metal patterns and a plurality of dielectric patterns are repeatedly arranged.

According to various embodiments, although the superlattice photodetector has an absorption layer having a thin thickness, the superlattice photodetector can have performance improved to a given level or more by including a construction for improving light absorption efficiency in the absorption layer. In this case, since the superlattice photodetector has the periodic structure, a dark current can be decreased and quantum efficiency can be improved in the superlattice photodetector. As the superlattice photodetector includes the capacitor layer, a charge integrated capacity of the superlattice photodetector can be increased. Accordingly, although the superlattice photodetector has an absorption layer having a thin thickness, the NETD characteristic of the superlattice photodetector can be excellent. Accordingly, although the superlattice photodetector has an absorption layer having a thin thickness and becomes thin, the superlattice photodetector can have performance improved to a given level or more. In other words, the superlattice photodetector can become thinned without the deterioration of performance.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein.

DETAILED DESCRIPTION

While illustrative embodiments have been illustrated and described, it will be appreciated that various changes can be made therein without departing from the spirit and scope of the disclosure.

Hereinafter, various embodiments of this document are described with reference to the accompanying drawings.

Figure 1:
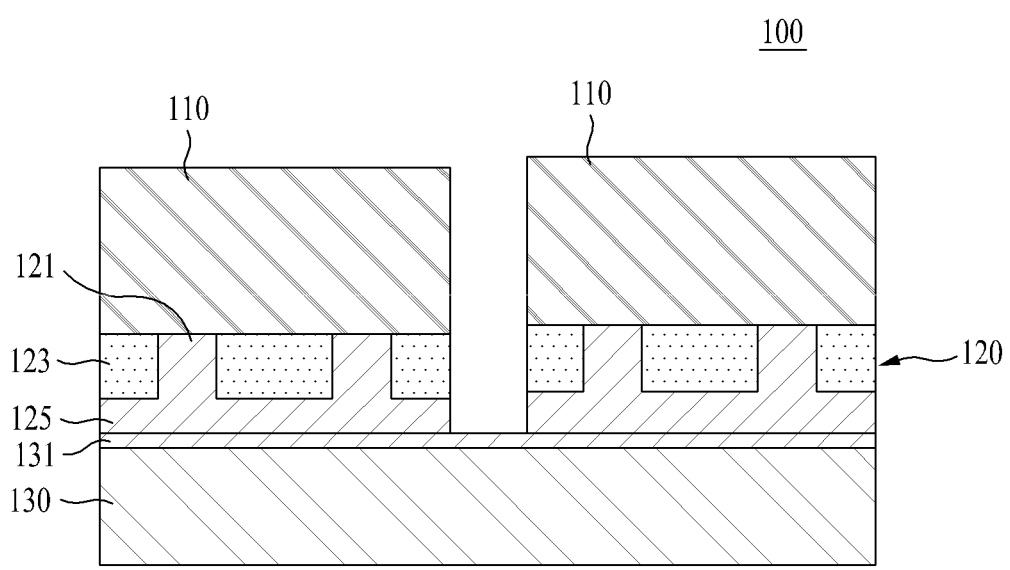
FIG. 1 is a diagram illustrating a superlattice photodetector according to first embodiments.
Figure 2:
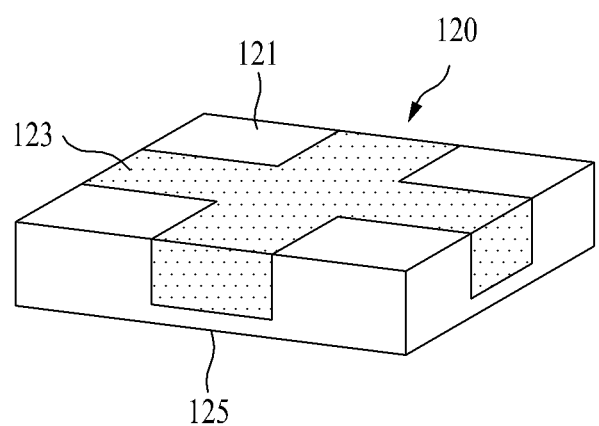
FIG. 2 is a perspective view illustrating a waveguide layer of FIG. 1.
Figure 3:
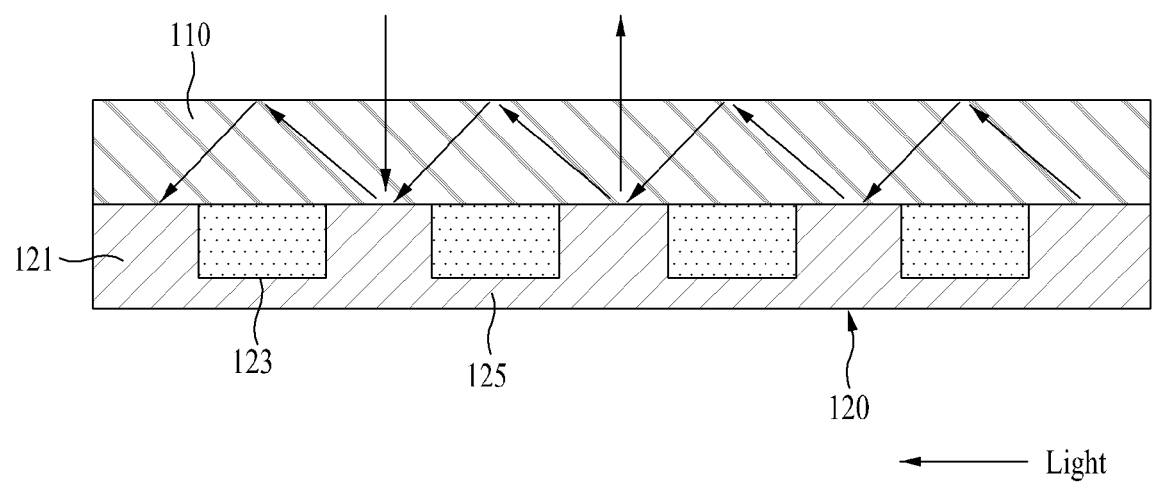
FIG. 3 is a diagram for describing an operating characteristic of an absorption layer and waveguide layer of FIG. 1.

FIG. 1 is a diagram illustrating a superlattice photodetector 100 according to first embodiments. FIG. 2 is a perspective view illustrating a waveguide layer 120 of FIG. 1. FIG. 3 is a diagram for describing an operating characteristic of the waveguide layer 120 of FIG. 1.

Referring to FIG. 1, the superlattice photodetector 100 according to the first embodiments may include an absorption layer 110, the waveguide layer 120, and a circuit layer 130.

The absorption layer 110 may absorb incident light. Furthermore, the absorption layer 110 may generate an optical signal with respect to the absorbed light. In this case, the absorption layer 110 may be implemented as a superlattice structure. The superlattice structure may indicate a structure in which layers having at least two materials are periodically arranged. According to an embodiment, the absorption layer 110 may be implemented as a superlattice structure of InAs and GaSb. For example, the absorption layer 110 may include a first contact layer, at least one active layer on the first contact layer, and a second contact layer on the active layer. In other words, in the absorption layer 110, the active layer may be disposed between the first contact layer and the second contact layer.

The waveguide layer 120 may enable light incident on the absorption layer 110 to be waveguided within the absorption layer 110. To this end, the waveguide layer 120 may be coupled with the absorption layer 110. Furthermore, the waveguide layer 120 may deliver, to the circuit layer 130, an optical signal generated by the absorption layer 110. To this end, the waveguide layer 120 may be electrically connected to the circuit layer 130. The waveguide layer 120 may include a periodic structure 121 and 123 and a metal layer 125.

The periodic structure 121 and 123 may be coupled with the absorption layer 110. The periodic structure 121 and 123 includes a plurality of metal patterns 121 and a plurality of dielectric patterns 123. The metal patterns 121 and the dielectric patterns 123 may be repeatedly arranged. In this case, the metal patterns 121 and the dielectric patterns 123 may be repeated along at least one of a column or a row in the periodic structure 121 and 123. According to an embodiment, as illustrated in FIG. 2, the metal patterns 121 are spaced apart from one another and are disposed as a checkerboard array. The electric patterns 123 may be disposed between the metal patterns 121. Accordingly, as illustrated in FIG. 3, as the periodic structure 121 and 123 refracts or reflects, toward the absorption layer 110, light passing through the absorption layer 110, the light passing through the absorption layer 110 can be waveguided within the absorption layer 110. Accordingly, in the absorption layer 110, guided-mode resonance absorption in which waveguided light is absorbed in addition to single path absorption in which incident light is directly absorbed can be performed. Furthermore, the metal patterns 121 may come into contact with the first contact layer of the absorption layer 110, and may be electrically connected to the absorption layer 110. Accordingly, the metal patterns 121 may obtain an optical signal from the absorption layer 110.

The metal layer 125 may support the periodic structure 121 and 123. In this case, the metal layer 125 may be disposed on a side opposite to the absorption layer 110 with the periodic structure 121 and 123 interposed therebetween. Furthermore, the metal layer 125 may be electrically connected to the metal patterns 121. Furthermore, the metal layer 125 may be electrically connected to the circuit layer 130. Accordingly, the metal layer 125 may obtain an optical signal through the metal patterns 121, and may deliver the optical signal to the circuit layer 130.

The circuit layer 130 may support the absorption layer 110 and the waveguide layer 120. To this end, the circuit layer 130 may be disposed on a side opposite to the absorption layer 110 with the waveguide layer 120 interposed therebetween. The circuit layer 130 may convert an optical signal into an electrical signal and output the electrical signal. To this end, the circuit layer 130 may be electrically connected to the waveguide layer 120. In this case, the circuit layer 130 may include an electrode layer 131 on a surface that faces the waveguide layer 120. The electrode layer 131 may come into contact with the metal layer 125 of the waveguide layer 120, and may be electrically connected to the waveguide layer 120. Accordingly, the circuit layer 130 may detect an optical signal through the waveguide layer 120.

The superlattice photodetector 100 according to the first embodiments may be manufactured using a monolithic method. That is, on the circuit layer 130, the area of the waveguide layer 120 may be similar to or identical with the area of the absorption layer 110. This will be described layer with reference to FIGS. 4A to 4H. FIGS. 4A to 4H are diagrams for describing a method of manufacturing the superlattice photodetector 100 according to the first embodiments.

Figure 4A:
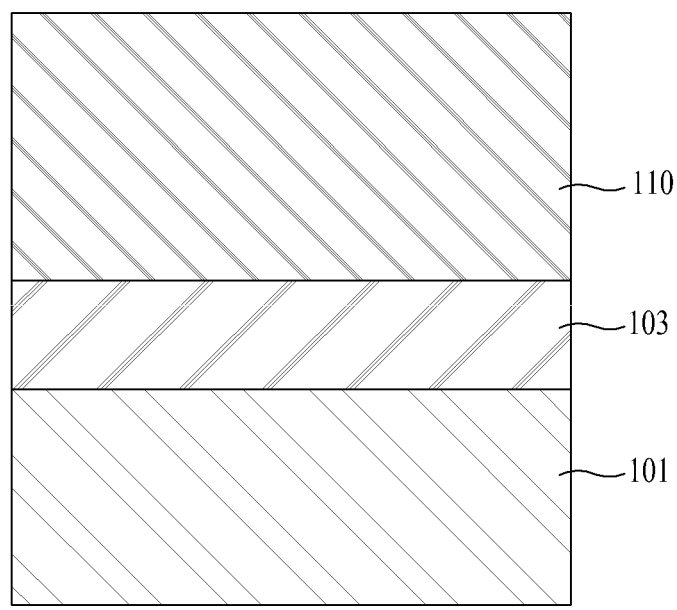
FIGS. 4A to 4H are diagrams for describing a method of manufacturing the superlattice photodetector 100 according to the first embodiments.

First, as illustrated in FIG. 4A, the absorption layer 110 may be prepared. In this case, the substrate 101 may be prepared, and the absorption layer 110 may be formed over a substrate 101. For example, after an etch stop layer 103 is formed on the substrate 101, the absorption layer 110 may be formed on the etch stop layer 103. The absorption layer 110 may be implemented as a superlattice structure. The superlattice structure may indicate a structure in which layers including at least two materials are periodically arranged. According to an embodiment, the absorption layer 110 may be implemented as a superlattice structure of InAs and GaSb.

Next, as illustrated in FIGS. 4B, 4C, 4D and 4E, the waveguide layer 120 may be formed on the absorption layer 110. The waveguide layer 120 may include the periodic structure 121 and 123 and the metal layer 125. In this case, after the periodic structure 121 and 123 is formed on the absorption layer 110, the metal layer 125 may be formed on the periodic structure 121 and 123.

Figure 4B:
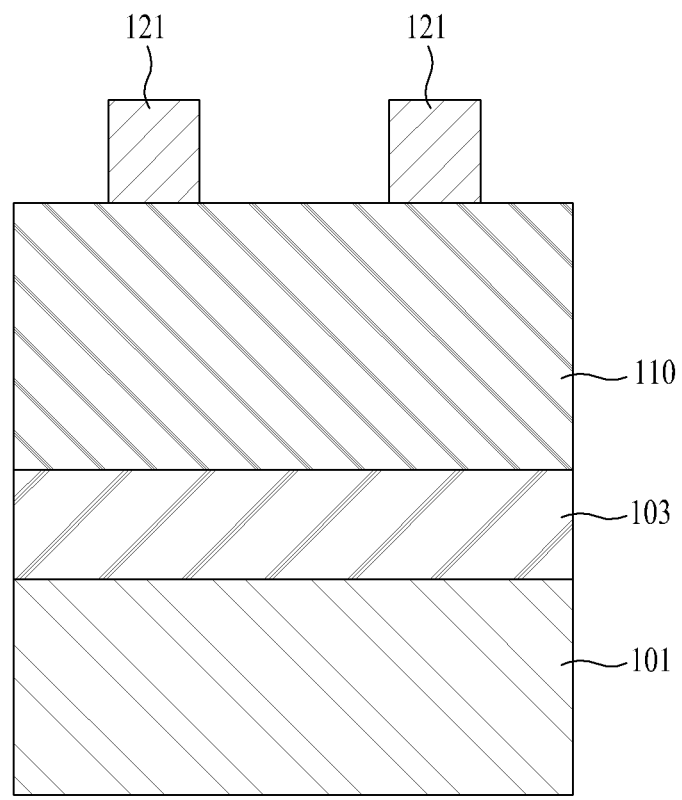

As illustrated in FIG. 4B, the plurality of metal patterns 121 may be formed on the absorption layer 110. In this case, the metal patterns 121 may be formed in a way to be spaced apart from one another along at least one of a column or a row. According to an embodiment, the metal patterns 121 may be formed in a way to be disposed as a checkerboard array. For example, as a metal material is deposited on the absorption layer 110, the metal patterns 121 may be formed.

Figure 4C:
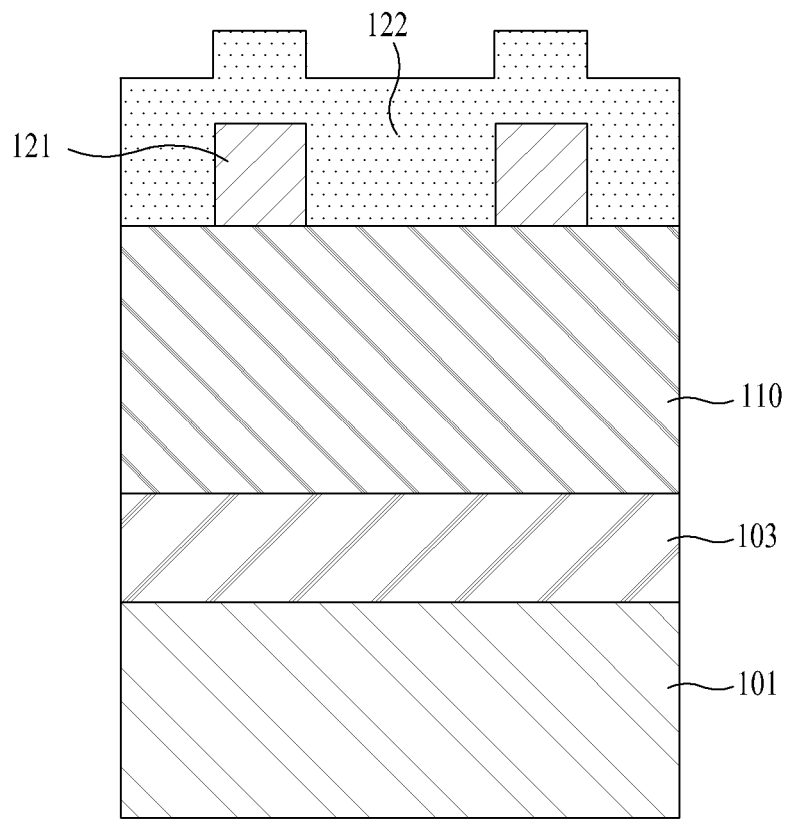

As illustrated in FIG. 4C, a dielectric material 122 may be deposited on the absorption layer 110 and the metal patterns 121. In this case, the dielectric material 122 may be deposited in a way to be inserted between the metal patterns 121, and may also be deposited on the metal patterns 121.

Figure 4D:
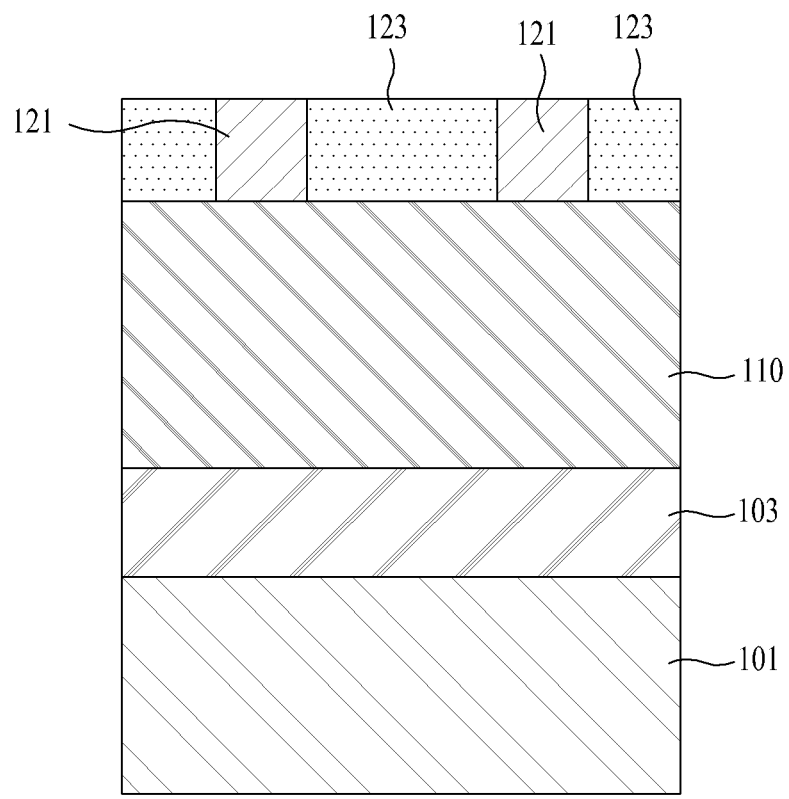

As illustrated in FIG. 4D, the dielectric patterns 123 may be formed through polishing on the metal patterns 121. That is, as polishing is performed so that the dielectric material 122 on the metal patterns 121 is removed, the dielectric material 122 between the metal patterns 121 may remain as the dielectric patterns 123. In other words, the dielectric patterns 123 may be formed in a way to be disposed between the metal patterns 121. In this case, the metal patterns 121 and the dielectric patterns 123 may be repeated along at least one of a column or a row in the periodic structure 121 and 123. Furthermore, the metal patterns 121 and the dielectric patterns 123 may have the same height. For example, the polishing may be performed using a chemical mechanical polishing method. Accordingly, the periodic structure 121 and 123 in which the metal patterns 121 and the dielectric patterns 123 are repeatedly arranged may be coupled with the top of the absorption layer 110.

Figure 4E:
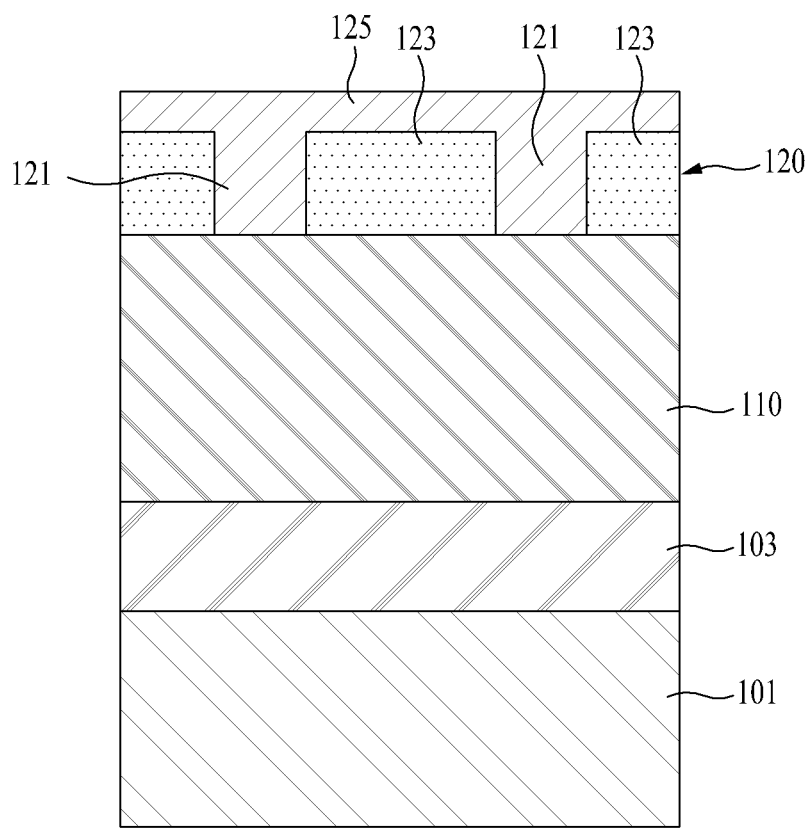

As illustrated in FIG. 4E, the metal layer 125 may be formed on the periodic structure 121 and 123 including the metal patterns 121 and the electric patterns 123. Accordingly, the metal layer 125 may be disposed on a side opposite to the absorption layer 110 with the periodic structure 121 and 123 interposed therebetween. Furthermore, the metal layer 125 may be electrically connected to the metal patterns 121. Accordingly, the waveguide layer 120 including the periodic structure 121 and 123 and the metal layer 125 is implemented. The waveguide layer 120 may be coupled with the top of the absorption layer 110.

Figure 4F:
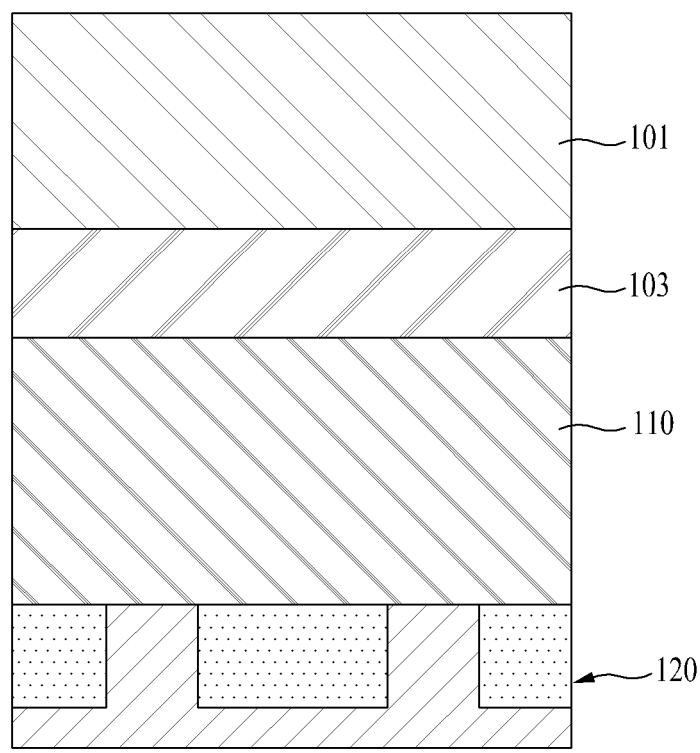
Figure 4F:
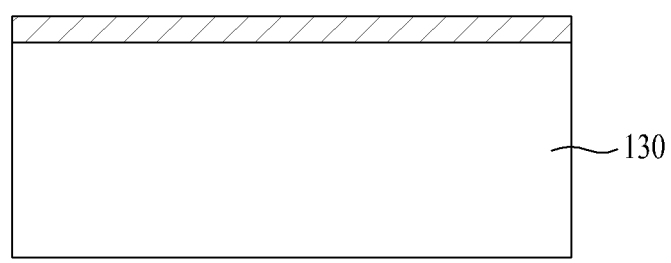

Next, as illustrated in FIG. 4F, the absorption layer 110 and the waveguide layer 120 may be rotated around the circuit layer 130 in a way to be inverted. That is, after the waveguide layer 120 is formed on the absorption layer 110, the absorption layer 110 and the waveguide layer 120 may be inverted so that the waveguide layer 120 is directed toward the circuit layer 130. That is, the absorption layer 110 may be disposed on the waveguide layer 120, the etch stop layer 103 may be disposed on the absorption layer 110, and the substrate 101 may be disposed on the etch stop layer 103.

Figure 4G:
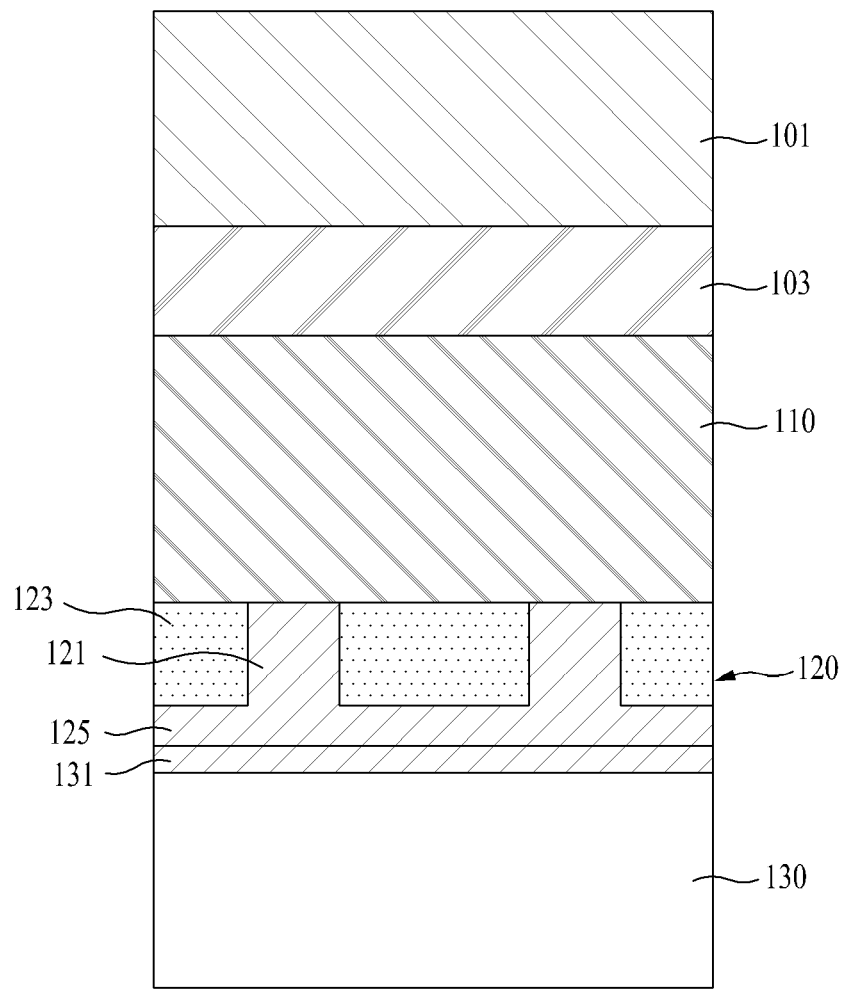
Figure 4H:
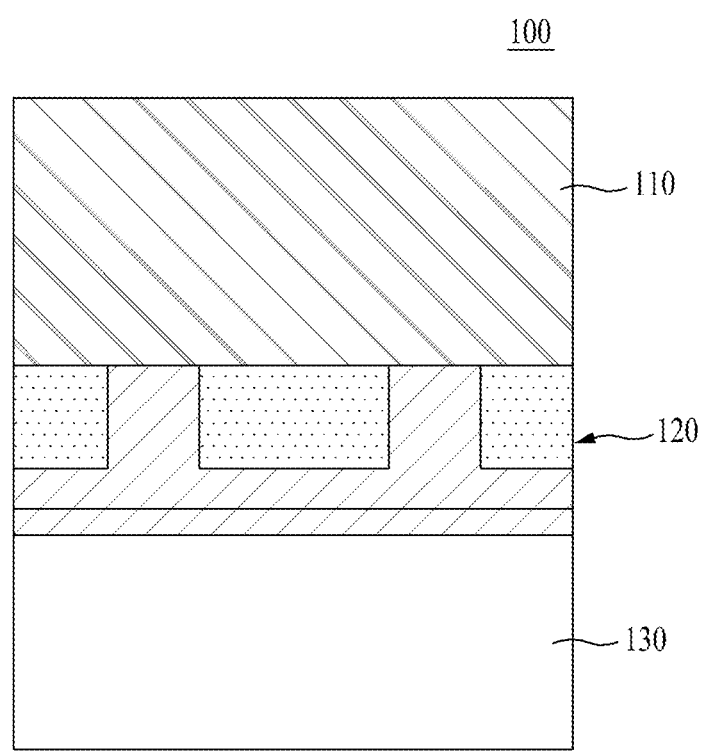

Finally, as illustrated in FIGS. 4G and 4H, the waveguide layer 120 may be disposed over the circuit layer 130. As illustrated in FIG. 4G, the waveguide layer 120 may be disposed over the circuit layer 130. In this case, as the waveguide layer 120 is disposed over the circuit layer 130, the waveguide layer 120 may be electrically connected to the circuit layer 130. In this case, the circuit layer 130 may include the electrode layer 131 on a surface that faces the waveguide layer 120. The metal layer 125 of the waveguide layer 120 may come into contact with the electrode layer 131 and may be electrically connected thereto. For example, the metal layer 125 may be coupled with the electrode layer 131 by using a wire bonding method. Thereafter, as illustrated in FIG. 4H, the substrate 101 and the etch stop layer 103 may be removed. Accordingly, the absorption layer 110 may be exposed. As a result, the superlattice photodetector 100 according to the first embodiments may be manufactured. Although not illustrated, a filter (not illustrated) may be additionally mounted on the absorption layer 110.

Figure 5:
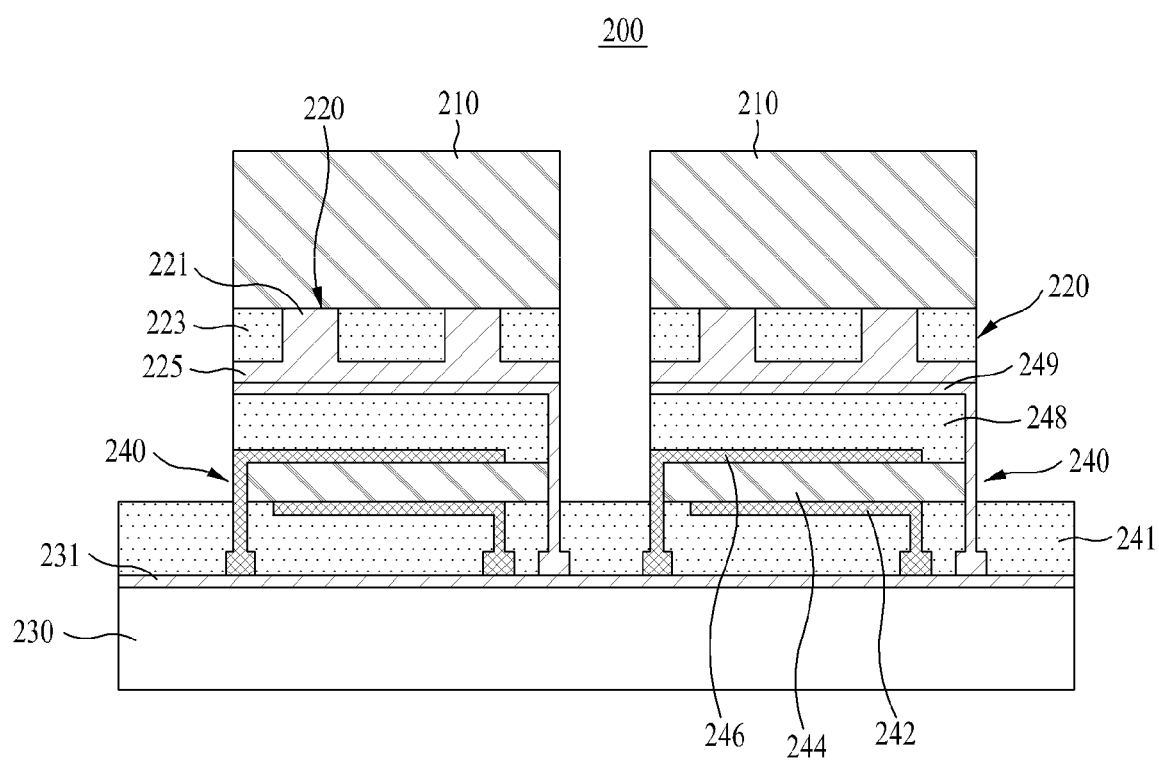
FIG. 5 is a diagram illustrating a superlattice photodetector according to second embodiments.

FIG. 5 is a diagram illustrating a superlattice photodetector 200 according to second embodiments.

Referring to FIG. 5, the superlattice photodetector 200 according to the second embodiments may include an absorption layer 210, a waveguide layer 220, a circuit layer 230, and a capacitor layer 240. In this case, the absorption layer 210, waveguide layer 220, and circuit layer 230 of the superlattice photodetector 200 according to the second embodiments are constructed similar to the absorption layer 110, waveguide layer 120, and circuit layer 130 of the superlattice photodetector 100 according to the first embodiments, respectively, and thus detailed descriptions thereof may be omitted. In this case, the waveguide layer 220 includes a periodic structure 221 and 223 in which a plurality of metal patterns 221 and a plurality of electric patterns 223 are repeatedly arranged and a metal layer 225. The circuit layer 230 may include an electrode layer 231.

According to the second embodiments, the capacitor layer 240 may provide additional capacitance in addition to capacitance of the circuit layer 230. The capacitor layer 240 may be disposed between the waveguide layer 220 and the circuit layer 230. Furthermore, the capacitor layer 240 may be electrically connected to the circuit layer 230. Accordingly, the capacitor layer 240 may provide additional capacitance to the circuit layer 230. The capacitor layer 240 may include a first protection layer 241, a first metal layer 242, an insulating layer 244, a second metal layer 246, a second protection layer 248 and a coupling layer 249.

The first protection layer 241 may be disposed over the circuit layer 230. The first metal layer 242 may be disposed on the first protection layer 241. Furthermore, the first metal layer 242 may be electrically connected to the circuit layer 230 through the first protection layer 241. The insulating layer 244 may be disposed on the first metal layer 242. The second metal layer 246 may be disposed on the insulating layer 244. Furthermore, the second metal layer 244 may be electrically connected to the circuit layer 230 through at least one of the insulating layer 244 or the first protection layer 241. In this case, the first metal layer 242 and the second metal layer 246 may be spaced apart from each other with the insulating layer 244 interposed therebetween. A distance between the first metal layer 242 and the second metal layer 246 may correspond to the thickness of the insulating layer 244. Furthermore, the first metal layer 242 and the second metal layer 246 are not brought into contact with each other by the first protection layer 241 and the insulating layer 244, and may be individually connected to the circuit layer 230. The second protection layer 248 may be disposed on the second metal layer 246. Accordingly, capacitance formed between the first metal layer 242 and the second metal layer 246 may be provided as additional capacitance for the circuit layer 230. In this case, the additional capacitance may be determined based on an area and thickness of the capacitor layer 240. For example, the additional capacitance may be determined based on an area where the first metal layer 242 and the second metal layer 246 overlap or a distance between the first metal layer 242 and the second metal layer 246 by the insulating layer 244.

The coupling layer 249 may be disposed on the second protection layer 248. In this case, the coupling layer 249 may be separated from the second metal layer 246 by the second protection layer 248. Furthermore, the coupling layer 249 may be electrically connected to the circuit layer 230 through at least one of the first protection layer 241, the insulating layer 244 or the second protection layer 248. Furthermore, the coupling layer 249 may come into contact with the metal layer 225 of the waveguide layer 220, and may be electrically connected to the waveguide layer 220. Accordingly, the coupling layer 249 may obtain an optical signal from the waveguide layer 220 and deliver the optical signal to the circuit layer 230.

According to the second embodiments, the circuit layer 230 may support the capacitor layer 240 in addition to the absorption layer 210 and the waveguide layer 220. In this case, the circuit layer 230 may be coupled with the capacitor layer 240, and may be disposed on a side opposite to the waveguide layer 220 with the capacitor layer 240 interposed therebetween. The circuit layer 230 may convert an optical signal into an electrical signal by using additional capacitance provided by the capacitor layer 240 in addition to internal capacitance, and may output the electrical signal. In this case, the electrode layer 231 of the circuit layer 230 may be electrically connected to the first metal layer 242, the second metal layer 246 and the coupling layer 249.

The superlattice photodetector 200 according to the second embodiments may be manufactured using the monolithic method. That is, on the circuit layer 230, the waveguide layer 220 and the capacitor layer 240 may be formed to have an area similarly to or identically with the area of the absorption layer 210. This will be described later with reference to FIGS. 6A to 6D along with FIGS. 4A to 4E. FIGS. 6A to 6D are diagrams for describing a method of manufacturing the superlattice photodetector 200 according to the second embodiments.

First, the absorption layer 210 may be prepared. The waveguide layer 220 may be formed on the absorption layer 210. In this case, the absorption layer 210 and the waveguide layer 220 according to the second embodiments are formed using a method similar to that of the absorption layer 110 and the waveguide layer 120 according to the first embodiments, respectively, and thus detailed descriptions thereof may be omitted. That is, similar to that illustrated in FIG. 4A, the absorption layer 210 may be formed may be formed on a substrate 201 and an etch stop layer 203. Thereafter, similar to those illustrated in FIGS. 4B, 4C, 4D and 4E, the waveguide layer 220 may be formed on the absorption layer 210. The waveguide layer 220 may include the periodic structure 221 and 223 and the metal layer 225. In this case, after the periodic structure 221 and 223 is formed on the absorption layer 210, the metal layer 225 may be formed on the periodic structure 221 and 223.

Figure 6A:
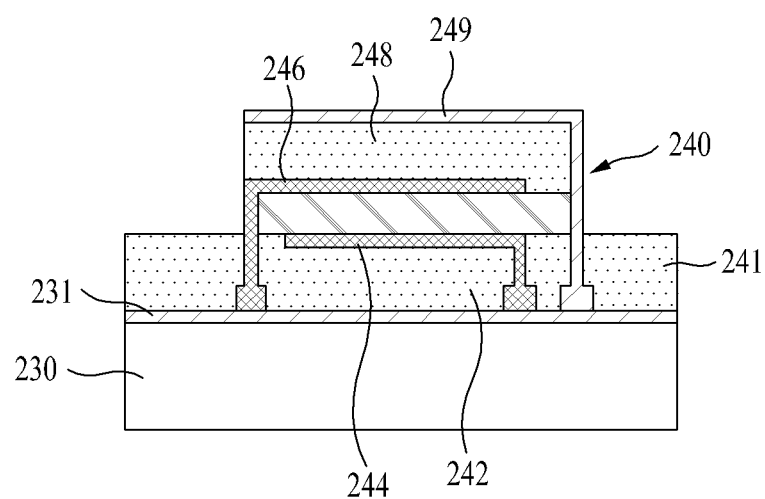
FIGS. 6A to 6D are diagrams for describing a method of manufacturing a superlattice photodetector according to the second embodiments.

As illustrated in FIG. 6A, the capacitor layer 240 may be formed on the circuit layer 230. In this case, the capacitor layer 240 is formed using the monolithic method, so that the capacitor layer 240 may be formed to have an area similarly to or identically with the area of the absorption layer 110. The capacitor layer 240 may include the first protection layer 241, the first metal layer 242, the insulating layer 244, the second metal layer 246, the second protection layer 248 and the coupling layer 249. After the first protection layer 241 is formed over the circuit layer 230, the first metal layer 242 may be formed on the first protection layer 241. Furthermore, the first metal layer 242 may be electrically connected to the electrode layer 231 of the circuit layer 230 through the first protection layer 241. Thereafter, after the insulating layer 244 is formed on the first metal layer 242, the second metal layer 246 may be formed on the insulating layer 244. Furthermore, the second metal layer 244 may be electrically connected to the electrode layer 231 of the circuit layer 230 through at least one of the insulating layer 244 or the first protection layer 241. Next, after the second protection layer 248 is formed on the second metal layer 246, the coupling layer 249 may be formed on the second protection layer 248. Furthermore, the coupling layer 249 may be electrically connected to the electrode layer 231 of the circuit layer 230 through at least one of the first protection layer 241, the insulating layer 244 or the second protection layer 248.

Figure 6B:
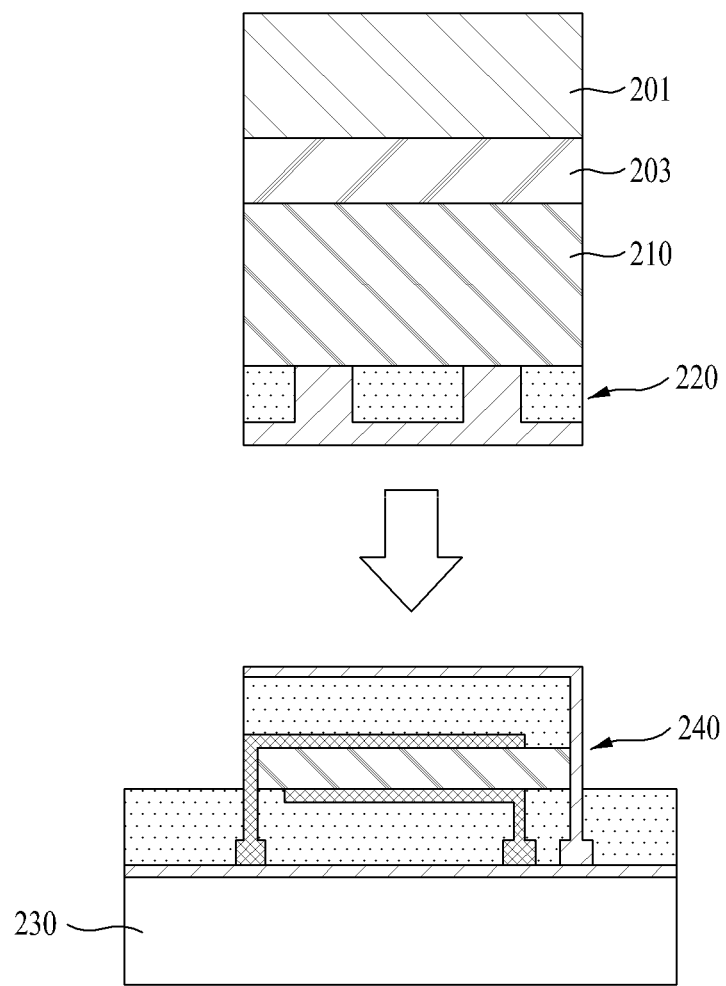

Continuously, as illustrated in FIG. 6B, the absorption layer 210 and the waveguide layer 220 may be rotated around the circuit layer 230 and the capacitor layer 240 in a way to be inverted. That is, after the waveguide layer 220 is formed on the absorption layer 210, the absorption layer 210 and the waveguide layer 220 may be inverted so that the waveguide layer 220 is directed toward the circuit layer 230 and the capacitor layer 240. That is, the absorption layer 210 may be disposed on the waveguide layer 220, the etch stop layer 203 may be disposed on the absorption layer 210, and the substrate 201 may be disposed on the etch stop layer 203.

Figure 6C:
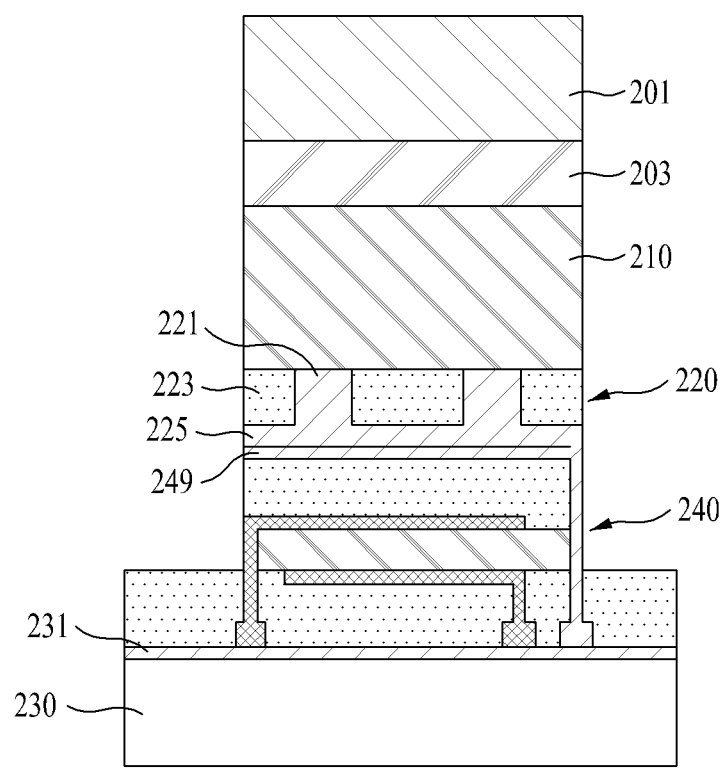
Figure 6D:
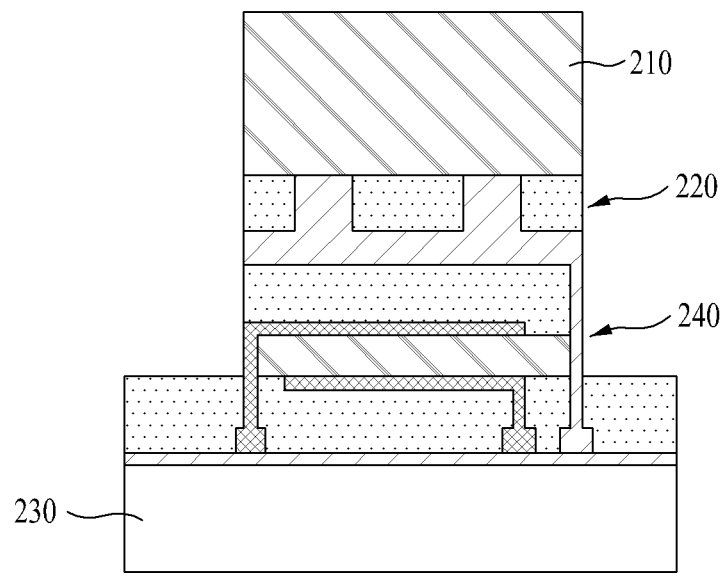

Finally, as illustrated in FIGS. 6C and 6D, the waveguide layer 220 may be coupled with the top of the capacitor layer 240. As illustrated in FIG. 6C, the waveguide layer 220 may be coupled with the top of the capacitor layer 240. In this case, as the waveguide layer 220 is mounted on the capacitor layer 240, the waveguide layer 220 may be electrically connected to the circuit layer 230. Specifically, the metal layer 225 of the waveguide layer 220 comes into contact with the coupling layer 249 of the capacitor layer 240 and is electrically connected thereto. Accordingly, the metal layer 225 may be electrically connected to the electrode layer 231 of the circuit layer 230 through the coupling layer 249. For example, the metal layer 225 may be coupled with the coupling layer 249 by a wire bonding method. Thereafter, as illustrated in FIG. 6D, the substrate 201 and the etch stop layer 203 may be removed. Accordingly, the absorption layer 210 may be exposed. As a result, the superlattice photodetector 200 according to the second embodiments may be manufactured. Although not illustrated, a filter (not illustrated) may be additionally mounted on the absorption layer 210.

Figure 7:
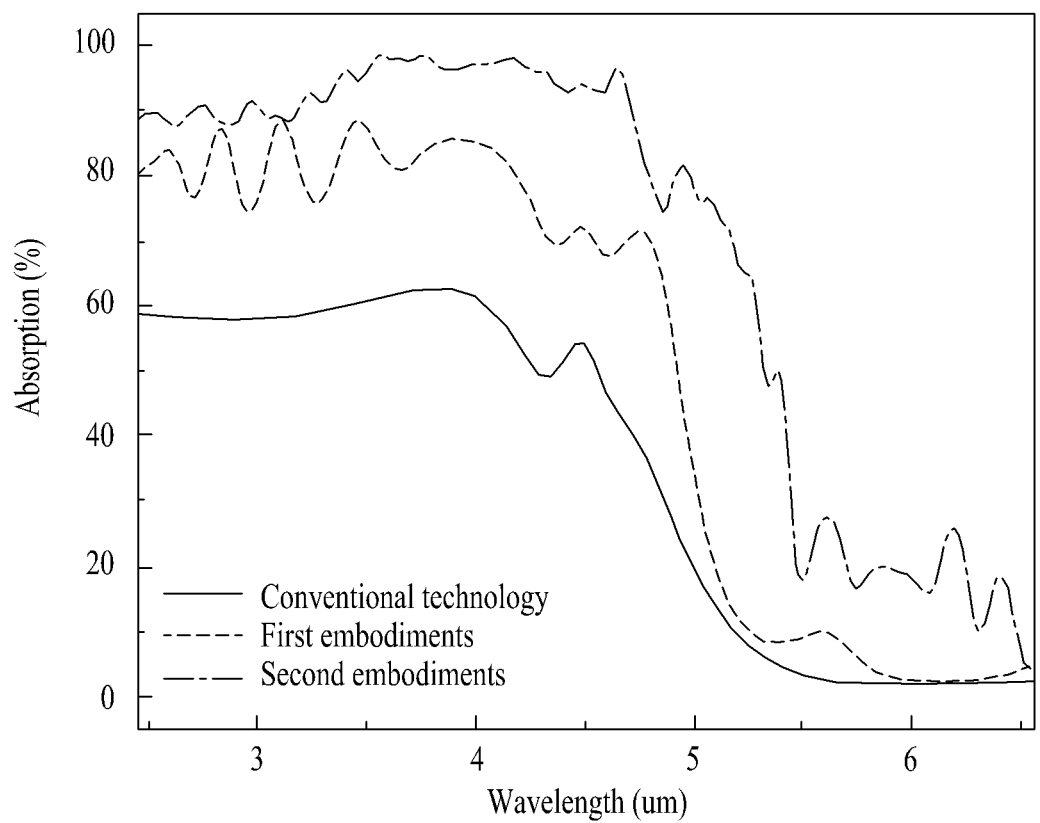
FIG. 7 is a diagram for describing performance of a superlattice photodetector according to various embodiments.

FIG. 7 is a diagram for describing performance of the superlattice photodetectors 100, 200 according to various embodiments.

Referring to FIG. 7, the superlattice photodetector 100, 200 according to various embodiments may have improved performance compared to a conventional technology. That is, in the superlattice photodetector 100, 200 according to various embodiments, light absorption efficiency of the absorption layer 110, 210 can be improved. According to the first embodiments, as the superlattice photodetector 100 includes the periodic structure 121 and 123, light absorption efficiency of the absorption layer 110 in the superlattice photodetector 100 can be improved. According to the second embodiments, as the superlattice photodetector 200 includes the periodic structure 221 and 223 and the capacitor layer 240, light absorption efficiency of the absorption layer 210 in the superlattice photodetector 200 can be improved. In other words, although the superlattice photodetector 100, 200 according to various embodiments have the absorption layer 110, 210 having a thin thickness compared to the existing technology, the superlattice photodetector 100, 200 can have improved performance compared to the existing technology.

According to various embodiments, although the superlattice photodetector 100, 200 have the absorption layer 110, 210 having a thin thickness, the superlattice photodetector 100, 200 can have performance improved to a given level or more because the absorption layer 110, 210 includes the construction for improving light absorption efficiency in the absorption layer 110, 210. In this case, as the superlattice photodetector 100, 200 include the periodic structure 121 and 123, 221 and 223, a dark current can be decreased and quantum efficiency can be improved in the superlattice photodetector 100, 200. As the superlattice photodetector 200 includes the capacitor layer 240, a charge integrated capacity in the superlattice photodetector 200 can be increased. Accordingly, although the superlattice photodetector 100, 200 has the absorption layer 110, 210 having a thin thickness, the NETD characteristics of the superlattice photodetector 100, 200 can be excellent. Accordingly, although the superlattice photodetector 100, 200 becomes thin with the absorption layer 110, 210 having thin thicknesses, the superlattice photodetector 100, 200 can have performance improved to a given level or more. In other words, since the absorption layer 110, 210 have improved light absorption efficiency compared to the thickness, the superlattice photodetector 100, 200 can become thinned without deteriorating performance.

The superlattice photodetector 100, 200 according to various embodiments may include the absorption layer 110, 210 for absorbing incident light, and the waveguide layer 120, 220 coupled with the absorption layer 110, 210 and enabling the incident light to be waveguided within the absorption layer 110, 210.

According to various embodiments, the waveguide layer 120, 220 may include the periodic structure 121 and 123, 221 and 223 in which the plurality of metal patterns 121, 221 and the plurality of dielectric patterns 123, 223 are repeatedly arranged.

According to various embodiments, the metal patterns 121, 221 and the dielectric patterns 123, 223 may be repeated in the periodic structure 121 and 123, 221 and 223 along at least one of a column or a row.

According to various embodiments, the superlattice photodetector 100, 200 may further include the circuit layer 130, 230 disposed on a side opposite to the absorption layer 110, 210 with the waveguide layer 120, 220 interposed therebetween.

According to various embodiments, the superlattice photodetector 200 may further include the capacitor layer 240 disposed between the circuit layer 230 and the waveguide layer 220.

According to various embodiments, the capacitor layer 240 may include the first metal layer 242 disposed to face the circuit layer 230, the second metal layer 246 disposed to face the waveguide layer 220, and the insulating layer 244 disposed between the first metal layer 242 and the second metal layer 246.

According to various embodiments, the waveguide layer 120, 220 may further include the metal layer 125, 225 coupled with the periodic structure 121 and 123, 221 and 223, supporting the periodic structure 121 and 123, 221 and 223, and electrically connected to the circuit layer 130, 230.

According to various embodiments, the metal patterns 121, 221 may be spaced apart from one another and disposed as a checkerboard array. The dielectric patterns 123, 223 may be disposed between the metal patterns 121, 221.

According to various embodiments, the first metal layer 242 and the second metal layer 246 may be electrically connected to the circuit layer 230.

A method of manufacturing the superlattice photodetector 100, 200 according to various embodiments may include steps of preparing the absorption layer 110, 210 for absorbing incident light and forming, on the absorption layer 110, 210, the waveguide layer 120, 220 for enabling the incident light to be waveguided within the absorption layer 110, 210.

According to various embodiments, the waveguide layer 120, 220 may include the periodic structure 121 and 123, 221 and 223 in which the plurality of metal patterns 121, 221 and the plurality of dielectric patterns 123, 223 are repeatedly arranged.

According to various embodiments, the metal patterns 121, 221 and the dielectric patterns 123, 223 may be repeated in the periodic structure 121 and 123, 221 and 223 along at least one of a column or a row.

According to various embodiments, the step of forming the waveguide layer 120, 220 may include steps of forming the metal patterns 121, 221 on the absorption layer 110, 210 and forming the dielectric patterns 123, 223 between the metal patterns 121, 221 on the absorption layer 110, 210.

According to the first embodiments, the method of manufacturing the superlattice photodetector 100 may further include a step of coupling the waveguide layer 120 with the top of the circuit layer 110 by rotating the absorption layer 110 and the waveguide layer 120 in a way to be inverted.

According to the second embodiments, the method of manufacturing the superlattice photodetector 200 may further include steps of forming the capacitor layer 240 over the circuit layer 230 and rotating the absorption layer 210 and the waveguide layer 220 in a way to be inverted and mounting the waveguide layer 220 on the capacitor layer 240.

According to the second embodiments, the capacitor layer 240 may include the first metal layer 242 disposed to face the circuit layer 230, the second metal layer 246 disposed to face the waveguide layer 220, and the insulating layer 244 disposed between the first metal layer 242 and the second metal layer 246.

According to the second embodiments, the step of forming the capacitor layer 240 may include steps of forming the first protection layer 241 over the circuit layer 230, forming the capacitor layer 240 on the first protection layer 241, and forming the second protection layer on the capacitor layer.

According to the second embodiments, the first metal layer 242 and the second metal layer 244 may be electrically connected to the circuit layer 230 through the first protection layer 241.

According to the second embodiments, the step of mounting the waveguide layer 220 may include a step of mounting the waveguide layer 220 on the second protection layer 248.

According to the second embodiments, the waveguide layer 220 may be electrically connected to the circuit layer 230 through at least one of the first protection layer 241 or the second protection layer 248.

According to various embodiments, the step of preparing the absorption layer 110, 210 may include a step of forming the absorption layer 110, 210 over the substrate 101, 201.

According to the first embodiments, the method of manufacturing the superlattice photodetector 100 may further include a step of removing the substrate 101 after the waveguide layer 120 is coupled with the top of the circuit layer 130.

According to the second embodiments, the method of manufacturing the superlattice photodetector 100 may further include a step of removing the substrate 201 after the waveguide layer 220 is mounted on the capacitor layer 240.

According to various embodiments, the step of forming the waveguide layer 120, 220 may further include a step of forming the metal layer 125, 225 on the metal patterns 121, 221 and the dielectric patterns 123, 223.

According to various embodiments, the metal patterns 121, 221 may be spaced apart from one another and disposed as a checkerboard array. The dielectric patterns 123, 223 may be disposed between the metal patterns.

Various embodiments of this document and the terms used in the embodiments are not intended to limit the technology described in this document to a specific embodiment, but should be construed as including various changes, equivalents and/or alternatives of a corresponding embodiment. Regarding the description of the drawings, similar reference numerals may be used in similar components. An expression of the singular number may include an expression of the plural number unless clearly defined otherwise in the context. In this document, an expression, such as "A or B", "at least one of A and/or B", "A, B or C" or "at least one of A, B and/or C", may include all of possible combinations of listed items together. Expressions, such as "a first," "a second," "the first" or "the second", may modify corresponding components regardless of its sequence or importance, and are used to only distinguish one component from the other component and do not limit corresponding components. When it is described that one (e.g., a first) component is "(functionally or communicatively) connected to" or "coupled with" the other (e.g., a second) component, one component may be directly connected to the other component or may be connected to the other component through another component (e.g., a third component).

According to various embodiments, each (e.g., module or program) of the described elements may include a single entity or a plurality of entities. According to various embodiments, one or more elements or operations of the aforementioned elements may be omitted or one or more other elements or operations may be added. Alternatively or additionally, a plurality of elements (e.g., modules or programs) may be integrated into a single element. In such a case, the integrated element may perform a function performed by a corresponding one of the plurality of elements before at least one function of each of the plurality of elements is integrated identically or similarly. According to various embodiments, operations performed by a module, a program or another element may be executed sequentially, in parallel, iteratively or heuristically, or one or more of the operations may be executed in different order or may be omitted, or one or more other operations may be added.

The embodiments of the disclosure in which an exclusive property or privilege is claimed are defined as follows:

1. A superlattice photodetector comprising:
an absorption layer for absorbing incident light;
a waveguide layer coupled with the absorption layer and enabling the incident light to be waveguided within the absorption layer, the waveguide layer comprising a periodic structure in which a plurality of metal patterns and a plurality of dielectric patterns are repeatedly arranged;
a circuit layer disposed on a side opposite to the absorption layer with the waveguide layer interposed between the circuit layer and the absorption layer; and
a capacitor layer disposed between the circuit layer and the waveguide layer.

2. The superlattice photodetector of claim 1, wherein the metal patterns and the dielectric patterns are repeated in the periodic structure along at least one of a column or a row.

3. The superlattice photodetector of claim 2, wherein the metal patterns are spaced apart from one another and disposed as a checkerboard array, and
wherein the dielectric patterns are disposed between the metal patterns.

4. The superlattice photodetector of claim 1, wherein the capacitor layer comprises:
a first metal layer disposed to face the circuit layer;
a second metal layer disposed to face the waveguide layer; and
an insulating layer disposed between the first metal layer and the second metal layer.

5. The superlattice photodetector of claim 4, wherein the first metal layer and the second metal layer are electrically connected to the circuit layer.

6. A superlattice photodetector comprising:
an absorption layer for absorbing incident light;
a waveguide layer coupled with the absorption layer and enabling the incident light to be waveguided within the absorption layer, the waveguide layer comprising a periodic structure in which a plurality of metal patterns and a plurality of dielectric patterns are repeatedly arranged; and
a circuit layer disposed on a side opposite to the absorption layer with the waveguide layer interposed between the circuit layer and the absorption layer;
wherein the waveguide layer further comprises a metal layer coupled with the periodic structure, supporting the periodic structure, and electrically connected to the circuit layer.

7. A method of manufacturing a superlattice photodetector, comprising:
preparing an absorption layer for absorbing incident light; and
forming, on the absorption layer, a waveguide layer for enabling the incident light to be waveguided within the absorption layer,
wherein the waveguide layer comprises a periodic structure in which a plurality of metal patterns and a plurality of dielectric patterns are repeatedly arranged,
wherein the forming of the waveguide layer comprises forming the metal patterns on the absorption layer and forming the dielectric patterns between the metal patterns on the absorption layer.

8. The method of claim 7, wherein the metal patterns and the dielectric patterns are repeated in the periodic structure along at least one of a column or a row.

9. The method of claim 8, wherein the metal patterns are spaced apart from one another and disposed as a checkerboard array, and
wherein the dielectric patterns are disposed between the metal patterns.

10. The method of claim 7, further comprising rotating the absorption layer and the waveguide layer in a way to be inverted and coupling the waveguide layer with a top of the circuit layer.

11. The method of claim 10, wherein the preparing of the absorption layer comprises forming the absorption layer over a substrate, and
wherein the method further comprises removing the substrate after the waveguide layer is coupled with the top of the circuit layer.

12. The method of claim 7, further comprising:
forming a capacitor layer over the circuit layer; and
rotating the absorption layer and the waveguide layer in a way to be inverted and mounting the waveguide layer on the capacitor layer.

13. The method of claim 12, wherein the capacitor layer comprises:
a first metal layer disposed to face the circuit layer;
a second metal layer disposed to face the waveguide layer; and
an insulating layer disposed between the first metal layer and the second metal layer.

14. The method of claim 13, wherein the forming of the capacitor layer comprises:
forming a first protection layer over the circuit layer;
forming the capacitor layer on the first protection layer; and
forming a second protection layer on the capacitor layer,
wherein the first metal layer and the second metal layer are electrically connected to the circuit layer through the first protection layer.

15. The method of claim 14, wherein the mounting of the waveguide layer comprises mounting the waveguide layer on the second protection layer, and
wherein the waveguide layer is electrically connected to the circuit layer through at least one of the first protection layer or the second protection layer.

16. The method of claim 12, wherein the preparing of the absorption layer comprises forming the absorption layer over a substrate, and
wherein the method further comprises removing the substrate after the waveguide layer is mounted on the capacitor layer.

17. The method of claim 7, wherein the forming of the waveguide layer further comprises forming a metal layer on the metal patterns and the dielectric patterns.

* * * * *